US010896561B2

United States Patent
Horgan et al.

(10) Patent No.: US 10,896,561 B2
(45) Date of Patent: Jan. 19, 2021

(54) BUILDING ACCESS CONTROL SYSTEM WITH SPATIAL MODELING

(71) Applicant: Johnson Controls Technology Company, Auburn Hills, MI (US)

(72) Inventors: Donagh S. Horgan, Cork (IE); Jan R. Holliday, Maryville, IL (US); Eamonn O'Toole, Cork (IE)

(73) Assignee: Johnson Controls Technology Company, Auburn Hills, MI (US)

(*) Notice: Subject to any disclaimer, the term of this patent is extended or adjusted under 35 U.S.C. 154(b) by 163 days.

(21) Appl. No.: 16/269,384

(22) Filed: Feb. 6, 2019

(65) Prior Publication Data

US 2019/0244459 A1     Aug. 8, 2019

Related U.S. Application Data

(60) Provisional application No. 62/627,695, filed on Feb. 7, 2018.

(51) Int. Cl.
*G07C 9/00* (2020.01)
*G08B 13/08* (2006.01)
(Continued)

(52) U.S. Cl.
CPC ......... *G07C 9/00571* (2013.01); *G05B 17/02* (2013.01); *G06F 16/285* (2019.01);
(Continued)

(58) Field of Classification Search
CPC ..... G07C 9/00571; G07C 9/27; G06F 16/285; G06F 30/13
(Continued)

(56) References Cited

U.S. PATENT DOCUMENTS 9,142,106 B2   9/2015   Jerhotova et al.
9,652,813 B2   5/2017   Gifford et al.
(Continued)

FOREIGN PATENT DOCUMENTS

CN   106204392 A   12/2016
CN   10696026 A   7/2017
(Continued)

OTHER PUBLICATIONS

International Search report and Written Opinion for PCT/US2019/016924, dated Apr. 17, 2019, 14 pages.

*Primary Examiner* — Quan-Zhen Wang
*Assistant Examiner* — Mancil LittleJohn, Jr.
(74) *Attorney, Agent, or Firm* — Foley & Lardner LLP

(57) ABSTRACT

A method in an access control system includes maintaining a database of access control event data generated by a plurality of access control devices installed in a building and iterating through the access control event data in order to generate a connectivity model for the building. Generating the connectivity model includes, for each iteration, identifying a user interaction with a first door at a first time and a user interaction with a second door at a second time, determining if a difference between the first time and the second time is less than a threshold period of time, and either creating the connection between the first door and the second door or updating a weight associated with the connection. The connectivity model can be used in the access control system to correlate access control events across locations in a building or building campus.

22 Claims, 6 Drawing Sheets

(51) Int. Cl.
*G06F 16/28* (2019.01)
*G05B 17/02* (2006.01)
*G07C 9/27* (2020.01)
*G06F 30/13* (2020.01)

(52) U.S. Cl.
CPC .............. *G06F 30/13* (2020.01); *G07C 9/27* (2020.01); *G08B 13/08* (2013.01)

(58) Field of Classification Search
USPC ........................................... 340/545.1
See application file for complete search history.

(56) References Cited

U.S. PATENT DOCUMENTS

| | | | |
|---|---|---|---|
| 2005/0105765 A1* | 5/2005 | Han | G08B 13/19615 382/100 |
| 2007/0273497 A1 | 11/2007 | Kuroda et al. | |
| 2010/0134310 A1* | 6/2010 | Zheng | G07C 9/25 340/686.6 |
| 2011/0077950 A1 | 3/2011 | Hughston | |
| 2014/0327555 A1 | 11/2014 | Sager et al. | |
| 2016/0378268 A1* | 12/2016 | R | G08B 13/196 715/736 |
| 2016/0379326 A1 | 12/2016 | Chan-Gove et al. | |
| 2017/0084168 A1 | 3/2017 | Janchookiat | |
| 2017/0278003 A1 | 9/2017 | Liu | |
| 2017/0323389 A1 | 11/2017 | Vavrasek | |
| 2017/0345287 A1 | 11/2017 | Fuller et al. | |
| 2017/0357908 A1 | 12/2017 | Cabadi et al. | |
| 2018/0012159 A1 | 1/2018 | Kozloski et al. | |

FOREIGN PATENT DOCUMENTS

| | | |
|---|---|---|
| CN | 107147639 A1 | 9/2017 |
| JP | 2008-107930 A | 5/2008 |
| WO | WO-2017/192215 A1 | 11/2017 |
| WO | WO-2017/192422 A1 | 11/2017 |
| WO | WO-2017192215 A1 * | 11/2017 ............... G07C 9/23 |

* cited by examiner

BUILDING ACCESS CONTROL SYSTEM WITH SPATIAL MODELING

CROSS-REFERENCE TO RELATED PATENT APPLICATION

This application claims the benefit of and priority to U.S. Provisional Patent Application No. 62/627,695 filed Feb. 7, 2018, the entire disclosure of which is incorporated by reference herein.

BACKGROUND

The present disclosure relates generally to the field of building access control systems (ACS). Access control systems can restrict access to various locations or resources associated with a building or building campus. For example, access control systems may include card readers configured to open a locked door in response to receiving a signal from an identification card. Access control systems may generally include a centralized security operations center (SOC) such that a security staff can monitor a building and respond to potential security threats.

More efficient and intelligent access control systems are generally desired. Previous access control systems have failed to adequately identify patterns of access control events (e.g., access granted, door forced open) that pose potential threats to building security. For example, certain building spaces may be more sensitive to security threats than others. It would be desirous to have an access control system that can make intelligent decisions based on spatial relationships within a building.

SUMMARY

One implementation of the present disclosure is a method in an access control system. The method includes maintaining a database of access control event data generated by a plurality of access control devices installed in a building and iterating through the access control event data in order to generate a connectivity model for the building. For each iteration, the method includes identifying an interaction between a user and an access control device for a first door in the building that occurs at a first time, identifying an interaction between the user and an access control device for a second door in the building that occurs at a second time, determining if a difference between the first time and the second time is less than a threshold period of time, determining if the connectivity model includes a connection between the first door and the second door responsive to a determination that the difference is less than the threshold, creating the connection between the first door and the second door responsive to a determination that the connectivity model does not include the connection, and updating a weight associated with the connection responsive to a determination that the connectivity model does include the connection.

In some embodiments, the method further includes removing or disregarding the connection from the connectivity model based on the weight.

In some embodiments, removing or disregarding the connection from the connectivity model based on the weight includes removing or disregarding the connection from the connectivity model in response to the weight being less than a threshold.

In some embodiments, the connection is a first connection and the weight is a first weight, and removing or disregarding the first connection from the connectivity model based on the first weight includes removing or disregarding the first connection from the connectivity model based on a comparison of the first weight to a second weight associated with a second connection.

In some embodiments, the method further includes calculating a weight associated with each connection in the connectivity model and removing or disregarding the connection in response to the weight falling below a threshold percentage within a distribution of the weights across the connections in the connectivity model.

In some embodiments, the method further includes calculating a weight associated with each connection in the connectivity model, applying a model to the connections to separate the connections into a plurality of clusters of connections based on similarities of weights, determining a first cluster of the plurality of clusters having smallest weights, and removing or disregarding the connections belonging to the first cluster.

In some embodiments, the model is a multi-state Poisson mixture model, and determining the first cluster comprises identifying the first cluster as a cluster of the plurality of clusters having a smallest Poisson rate parameter from among a plurality of Poisson rate parameters of the plurality of clusters.

In some embodiments, the method further includes ignoring the interaction between the user and the first door and the interaction between the user and the second door responsive to a determination that the difference is greater than the threshold.

In some embodiments, the method further includes identifying an access control zone within the building using the connectivity model.

In some embodiments, the method further includes generating an alarm that indicates an intrusion associated with the building responsive to multiple door forced open events occurring within the access control zone within a time period.

In some embodiments, the method further includes estimating a probability of a first user coming into contact with a second user or a restricted location using the connectivity model based on a last access control device with which the first user interacted.

Another implementation of the present disclosure is an access control system. The system includes one or more processors and one or more computer-readable storage media having instructions stored thereon that, when executed by the one or more processors, cause the one or more processors to implement operations. The operations include includes maintaining a database of access control event data generated by a plurality of access control devices installed in a building and iterating through the access control event data in order to generate a connectivity model for the building. The operations include, for each interaction, identifying an interaction between a user and an access control device for a first door in the building that occurs at a first time, identifying an interaction between the user and an access control device for a second door in the building that occurs at a second time, determining if a difference between the first time and the second time is less than a threshold period of time, determining if the connectivity model includes a connection between the first door and the second door responsive to a determination that the difference is less than the threshold, creating the connection between the first door and the second door responsive to a determination that the connectivity model does not include the connection, and updating a weight associated with the connection responsive to a determination that the connectivity model does include the connection.

In some embodiments, the operations further include removing or disregarding the connection from the connectivity model based on the weight.

In some embodiments, removing or disregarding the connection from the connectivity model based on the weight includes removing or disregarding the connection from the connectivity model in response to the weight being less than a threshold.

In some embodiments, the connection is a first connection and the weight is a first weight, and removing or disregarding the first connection from the connectivity model based on the first weight includes removing or disregarding the first connection from the connectivity model based on a comparison of the first weight to a second weight associated with a second connection.

In some embodiments, the operations further include calculating a weight associated with each connection in the connectivity model and removing or disregarding the connection in response to the weight falling below a threshold percentage within a distribution of the weights across the connections in the connectivity model.

In some embodiments, the operations further include calculating a weight associated with each connection in the connectivity model, applying a model to the connections to separate the connections into a plurality of clusters of connections based on similarities of weights, determining a first cluster of the plurality of clusters having smallest weights, and removing or disregarding the connections belonging to the first cluster.

In some embodiments, the model is s a multi-state Poisson mixture model, and determining the first cluster includes identifying the first cluster as a cluster of the plurality of clusters having a smallest Poisson rate parameter from among a plurality of Poisson rate parameters of the plurality of clusters.

In some embodiments, the operations further include ignoring the interaction between the user and the first door and the interaction between the user and the second door responsive to a determination that the difference is greater than the threshold.

In some embodiments, the operations further include identifying an access control zone within the building using the connectivity model.

In some embodiments, the operations further include generating an alarm that indicates an intrusion associated with the building responsive to multiple door forced open events occurring within the access control zone within a time period.

In some embodiments, the operations further include estimating a probability of a first user coming into contact with a second user or a restricted location using the connectivity model based on a last access control device with which the first user interacted.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

DETAILED DESCRIPTION

Overview

Referring generally to the FIGURES, an access control system with spatial modeling features is shown, according to various embodiments. The access control system is configured to maintain a database of access control event data generated by a plurality of access control devices installed in a building or building campus. The access control devices may include card readers, biometric readers, keypad readers and other types of sensors. The access control events may include door forced open events, door held open events, access granted events, access denied events, and other types of events. The access control system includes an event processor configured to evaluate this access control event data in order to generate a connectivity model that defines connections between various access control devices and thereby connections between spaces in a building or building campus. The connectivity model facilitates dynamic processing of access control event data in order to provide functionality such as generating dynamic zones and audit logs.

Building Access Control System

Figure 1:
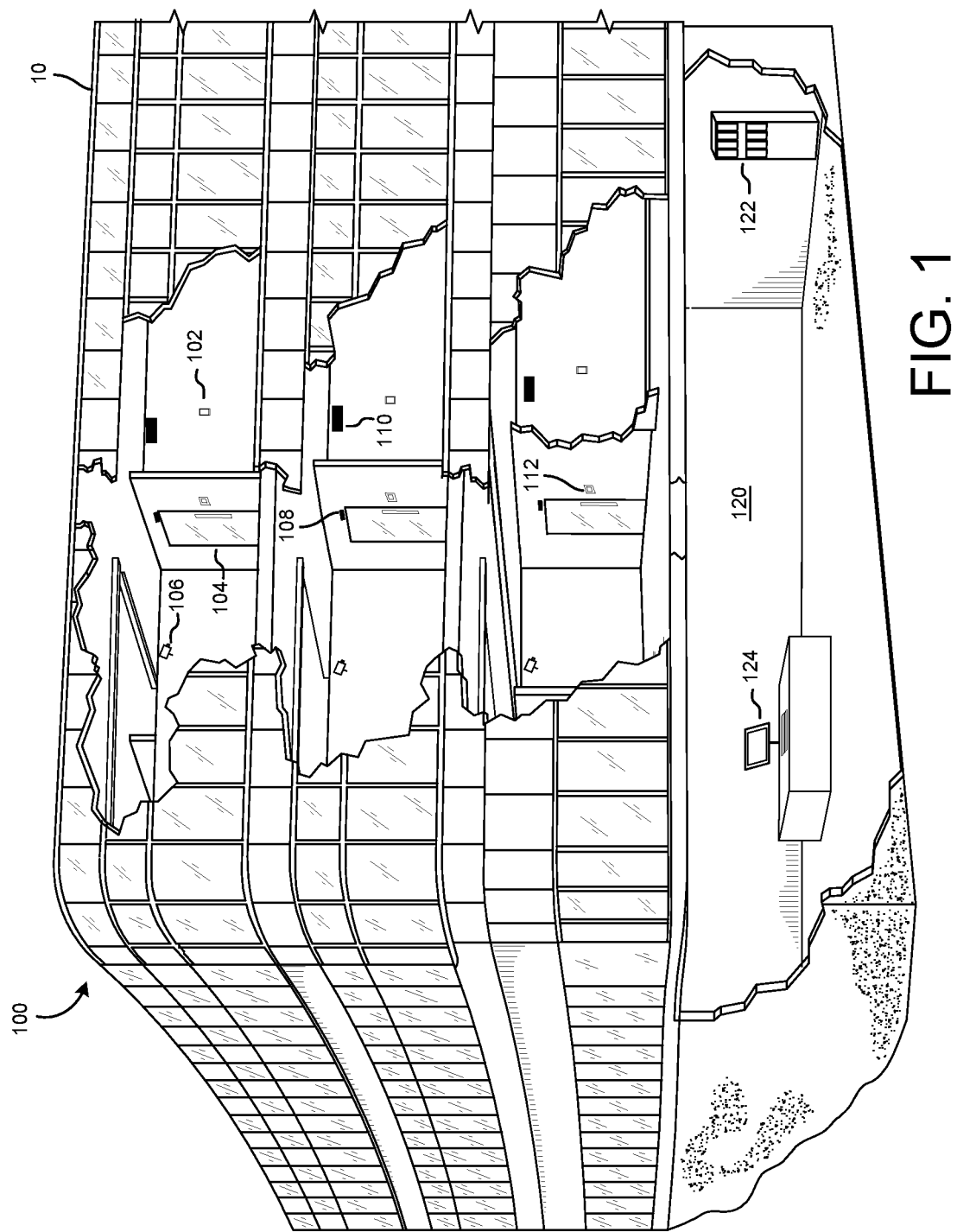
FIG. 1 is a drawing of an access control system installed in a building, according to some embodiments.

Referring to FIG. 1, a drawing of an example access control system 100 installed in a building 10 is shown, according to some embodiments. Access control system 100 is generally configured to restrict access to various resources (e.g., access points) and identify security threats associated with building 10. Access control system 100 can also be configured to perform this functionality for groups of building in disparate locations and/or across large building campuses. For example, access control system 100 can be used to restrict access to doors both internal and external to building 10. Access control system 100 can also be used to restrict access to parking areas, personal storage areas, and other types of places and resources. Access control system 100 includes different access control devices in communication with a security operations center (SOC) 120. Access control system 100 may be integrated with a variety of other building systems such as HVAC systems, lighting systems, fire suppression systems, and the like.

Access control system 100 is shown to include a request to exit device 102, an internal door 104, a camera 106, a door lock 108, a door controller 110, and a card reader 112. Request to exit device 102 may be a push button or other type of device that building occupants interact with to request access to door 104. Camera 106 may be one of a plurality of security cameras associated with access control system 100. Door lock 108 may be a magnetic door lock or other type of door lock configured to restrict access to a door associated with building 10. Card reader 112 may be configured to read magnetic or inductive identification cards that authenticate users within access control system 100. Door controller 110 may be in communication with devices such as camera 106, request to exit device 102, door lock 108, and card reader 112. It will be appreciated that access control system 100 can include a variety of other devices installed in a variety of configurations in addition to the drawing shown in FIG. 1. For example, access control system 100 may include access control devices such as biometric readers (e.g., fingerprint, iris recognition, facial recognition), motion detectors, keypad readers, turnstiles, and other types of sensors.

SOC 120 is shown to include both a server 122 as well as a workstation 124. Each of the access control devices associated with access control system 100 may be in communication with server 122. These connections may be established using a variety of wired and/or wireless communications protocols. In some embodiments, server 122 is not located within building 10 (on-premises) but instead is located in a remote location (cloud-based). Communications with a remote server may be facilitated by network switches or gateways installed in building 10. Access control system 100 may also be implemented using a combination of on-premises and remote servers. Workstation 124 may include a variety of computing devices such as personal computers, laptops, and displays through which security personnel may interact with access control system 100. For example, server 122 can be configured to generate and provide a user interface to security personnel through workstation 124. Security personnel may also interact with access control system 100 using mobile devices such as smartphones and tablets.

Spatial Modeling

Figure 2:
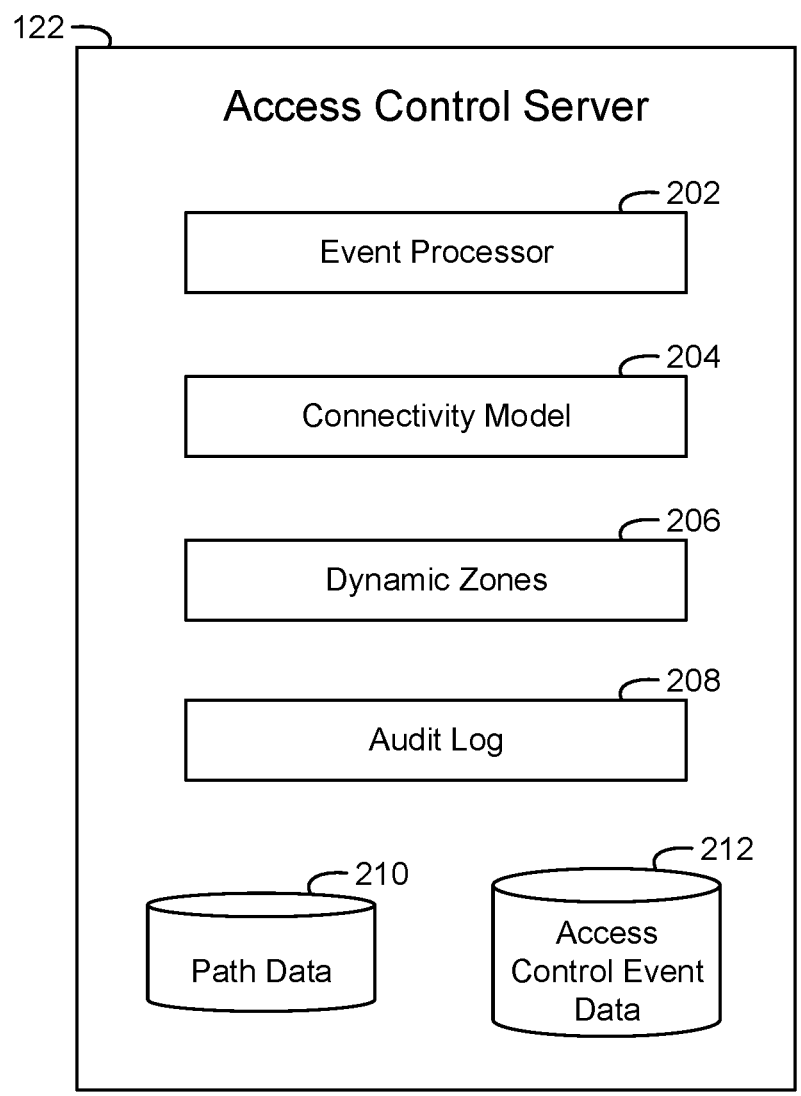
FIG. 2 is a block diagram showing example components of a server associated with the access control system of FIG. 1, according to some embodiments.

Referring now to FIG. 2, a block diagram showing some components of access control server 122 is shown, according to some embodiments. Server 122 is generally configured to manage access control event data associated with access control system 100. Server 122 is shown to include an event processor 202 that is configured to process live access control events and store access control event data in an access control event database 212. For example, event processor 202 can receive and process events generated by card readers, keypad readers, biometric readers, motion detectors, door controllers, electronic locks, and security cameras among other types of sensors and devices. Further, event processor 202 can be configured to enrich raw data received from such devices to provide additional context (e.g., labels, metadata) before storing the data in database 212. This functionality facilitates and enables various functions performed by event processor 202. In various embodiments, server 122 can be implemented using one or more processors and one or more computer-readable storage media (e.g., memories) having instructions stored thereon that, when executed by the one or more processors, implement operations providing the various features discussed in detail below.

Event processor 202 can be configured to process a variety of different types of access control events. For example, event processor 202 can be configured to process access granted (AG) events, door held open (DHO) events, door forced open (DFO) events, access denied (AD) events, communications failure events, glass break events, motion detection events, fire alarm events, burglar alarm events, and duress events among other types of events. Each event received by event processor 202 may include a device identifier and a timestamp in addition to other information. For example, an access granted event may include a device identifier (e.g., associated with a card reader), a timestamp, and a user identifier to identify the user that was granted access. In some embodiments, event processor 202 includes separate software components for processing different types of events.

A variety of different machine learning models can be built to in order to more effectively process and analyze access control event data, according to some example embodiments. These models can gain insight into the behavior of access control system 100 as installed in building 10 by evaluating an access control event dataset in order to discover patterns of interest. These patterns may be specific to a certain device (e.g., card reader), specific to different spaces within building 10, specific to different users of building 10, specific to different times, and specific to different event types. The integration of such models facilitates automation of previously manual procedures. Further, such models allow event processor 202 to more effectively diagnose a live stream of access control event data and highlight potential threats to the security of building 10. For example, previous systems have required the manual creation of static rules used to suppress nuisance events and false alarms. However, these static rules are susceptible to error and do not adjust to a dynamically changing security environment associated with building 10. Further, these static rules may only evaluate a single event without any context of separate but related events. The integration of machine learning models as described herein facilitate a dynamic access control environment that is tailored to a specific system configuration (e.g., a specific building).

As shown in FIG. 2, server 122 is configured to maintain a connectivity model 204. Connectivity model 204 can be generated and maintained by event processor 202 using access control event data. In some embodiments, connectivity model 204 is a dynamic model of relationships between doors in building 10. Connectivity model 204 provides access control system 100 with the ability to detect patterns of access control events across spaces of building 10. For example, event processor 202 can be configured to query connectivity model 204 in order to determine if an access denied event and a door forced open event are spatially related. The access denied event and the door forced open event may be associated with different device identifiers (e.g., different card readers). Systems that do not utilize connections or relationships between doors and other types of access points may fail to automatically connect the access denied event to the door forced open event. As such, these systems may fail to adequately respond to this pattern of events that indicates a threat to the security of building 10. However, connectivity model 204 can be used to dynamically and automatically relate the access denied event and the door forced open event such that an appropriate alarm is generated and the security threat is averted.

Connectivity model 204 can be used for a variety of purposes within access control system 100. For example, server 122 is shown to include dynamic zones 206 and an audit log 208. Dynamic zones 206 may include two or more spatially related access control devices (e.g., card readers). Dynamic zones 206 provide advantages over manually configured zones in that dynamic zones 206 automatically adjust based on usage patterns contained in access control event data. This functionality can be useful in automatically flagging unusual behavior. For example, if a user spends a long time in a sensitive zone, this may indicate loitering. Further, if a user is determined to be in a sensitive zone and is then shortly determined to be in a different zone, this may indicate duplication of an ID badge of other suspicious activity. Dynamic zones 206 can also be used to detect unusual changes in occupant behavior. For example, if a specific user typically does not enter a sensitive zone but is determined to be in such a zone for consecutive days in a row, this may indicate suspicious activity.

Audit log 208 may be generated by sever 122 in response to a request for an access audit. For example, many industries require that certain users do not go into certain locations of a building and/or that certain users do not come into contact with each other. Examples of such an industry may be the pharmaceutical industry or the finance industry. Connectivity model 204 can be used to quantify the measure the distance of such employees from protected access point to quantify how well-protected the access point is. Connectivity model 204 can also be used to predict when employees may come into contact with each other based on access control event data (e.g., last access point users were seen at). Connectivity model 204 can also be used to comply with requirements such as restraining orders. In some embodiments, audit log 206 includes an audit trail for a Chinese wall (e.g., screening barricade to prevent conflicts of interest between employees). Connectivity model 204 can also be used to predict how effective requirements like a Chinese wall may be in a given building environment.

Server 122 is also shown to include both a path database 210 and an access control event database 212. Path database can include a list of weighted connections or links between access control devices associated with building 10. For example, path database 210 may include a path between two doors and a weight dependent on how often that path is used by occupants of building 10. Path database 210 may further include an estimated distance of each path that can be calculated using an estimated human walking rate. More detail regarding how path database 210 can be maintained is described below. Access control event database 212 can include historical data related to events generated by access control devices associated with system 100. As mentioned above, event processor 202 can be configured to enrich raw data received from these access control devices to provide additional context (e.g., labels and metadata) before storing event data in database 212.

Figure 3:
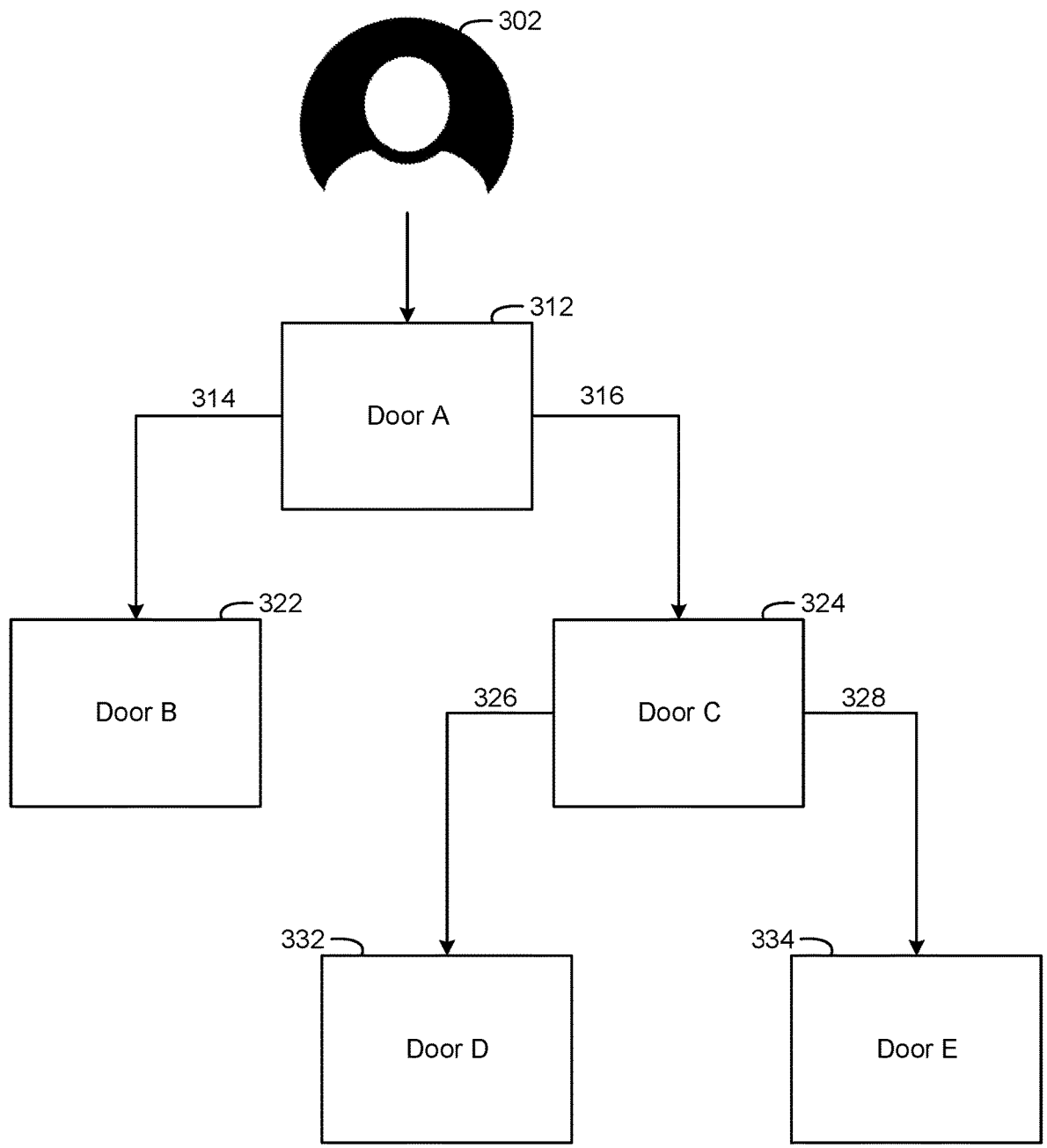
FIG. 3 is a block diagram showing example paths between doors in the building of FIG. 1, according to some embodiments.

Referring now to FIG. 3, a block diagram showing an example of connections between doors in building 10 is shown, according to some embodiments. A user 302 may enter door 312 and take either one of path 314 to arrive at door 322 or path 316 to arrive at door 324. Further, after user 302 enters door 324, user 302 may either take path 326 to arrive at door 332 or path 328 to arrive at door 334. Each of paths 314, 316, 326, and 328 serve as examples of paths that can be discovered by event processor 202, stored in path database 210, and contained in connectivity model 204.

Figure 4:
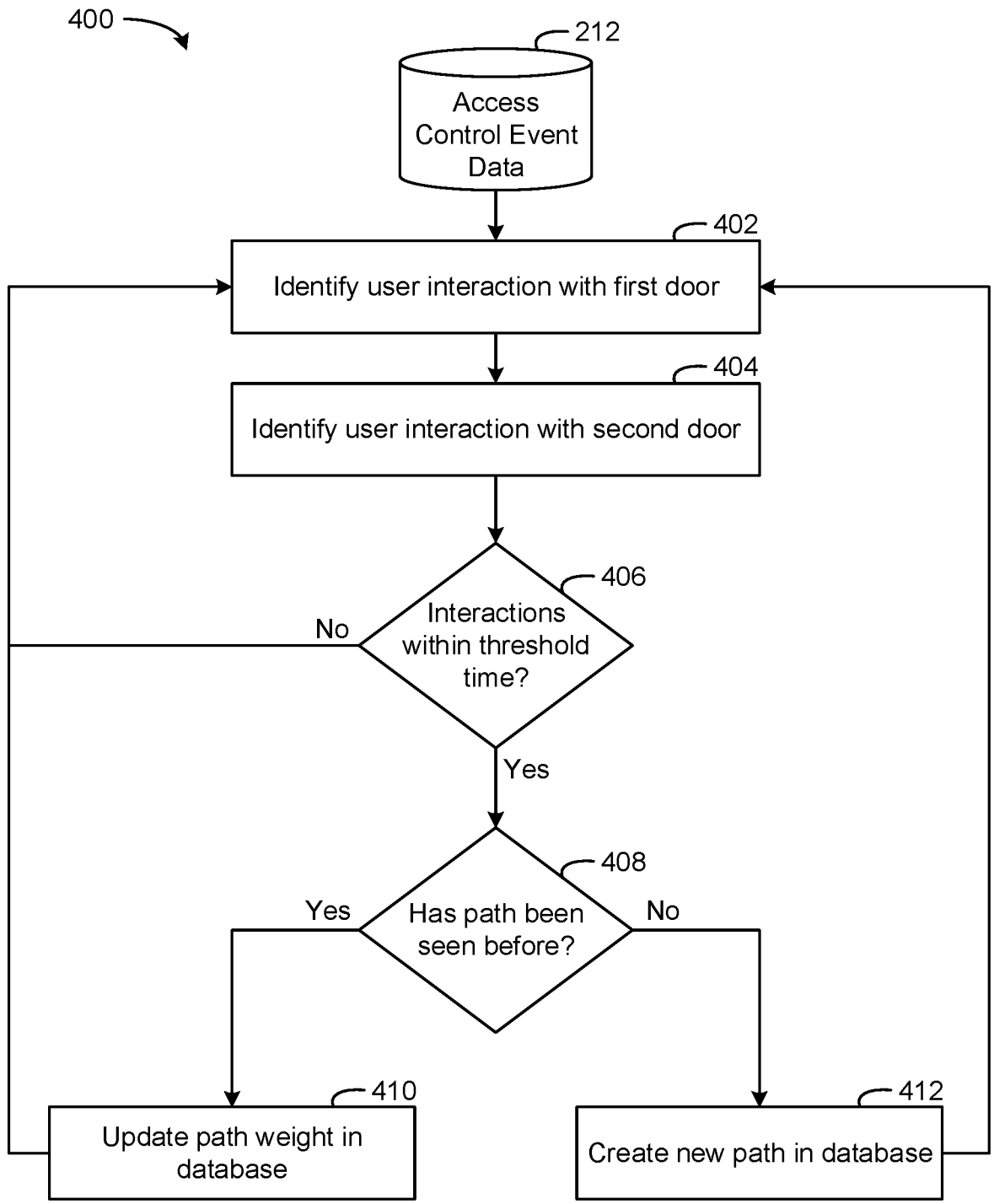
FIG. 4 is a flow diagram of a process for generating a connectivity model associated with the access control system of FIG. 1, according to some embodiments.

Referring now to FIG. 4, a process 400 for generating a connectivity model in an access control system is shown, according to some embodiments. Process 400 can be performed by event processor 202 using access control event data stored in database 212, for example. Process 400 can be used to automatically generate a connectivity model such as connectivity model 204 described above. It can be time consuming and ineffective to manually attempt to create such a connectivity model. Even if a manual connectivity model is created, such a model will not evolve with time as a model like connectivity model 204 can. Accordingly, process 400 can be implemented to deliver improved performance and efficiency of access control system 100.

Process 400 is shown to include identifying a user interaction with a first door (step 402). For example, event processor 202 may query database 212 in order to identify an access granted event associated with a specific access control device. The access granted event can include a device identifier that identifies the access control device (e.g., card reader) and thereby identifies the first door. Further, the access granted event can include a user identifier by the access control device. Referring to the example of FIG. 3, the user interaction identified in step 402 may be associated with door 312 and user 302, for example.

Process 400 is also shown to include identifying a user interaction with a second door (step 404). For example, similar to step 402, event processor 202 may again query database 212 in order to identify a second access granted event associated with the same user as the user in step 402. The user may again be determined using a user identifier associated with the second access granted event. However, in step 404, the device identifier associated with the access granted event is different from the device identifier associated with the first access granted event in step 402. Referring again to the example of FIG. 3, the user interaction identified in step 404 may be associated with user 302 and door 324.

Process 400 is also shown to include determining whether the interactions identified in steps 402 and 404 occur within a threshold period of time (step 406). The timing of the two interactions may be determined using timestamps associated with the first access granted event and the second access granted event, for example. In some embodiments, a floorplan of building 10 is used in combination with a standard rate of human walking pace to determine the threshold period of time. The threshold time may also account for other phenomenon such as time required to scan an ID badge or time required to provide input to a biometric reader. As an example, if the two doors are in close proximity to each other, the threshold period of time may be 30 seconds. However, it will be appreciated that this threshold may vary and can be dynamically adjusted. If the interactions do not fall within the threshold period of time, then process 400 may continue by ignoring the user interaction identified in step 402 and the user interaction identified in step 404 or otherwise discarding this connection. In this case, process 400 may return to step 402 and continue iterating through access control event database 212 to identify another pair of user interactions. However, if the interactions occur within the threshold period of time, process 400 continues to step 408 which includes determining whether the path has been seen before.

Referring again to the example of FIG. 3, the path in question at step 408 may be path 316. If path 316 has already been created in path database 210, then process 400 may continue with updating a weight associated with path 316 in path database 210. The weight may be a simple count (e.g., increment by one each time the path is seen) or may vary. For example, connections including doors of heightened security interest (e.g., doors providing external access to building 10) may be weighted higher. However, if path 316 has not been seen before and has not created within path database 210, then process 400 may continue with creating path 316 in database 210. As mentioned above, each path in database 210 may also include an estimate of the path distance. After steps 410 and 412, process 400 returns to step 402 and identifies another pair of user interactions in database 212. Process 400 may conclude once each interaction in database 212 has been analyzed. Moreover, once connectivity model 204 has been generated, it will be appreciated that the model can be dynamically updated as live access control event data is received by server 122.

Various methods are contemplated to generate connectivity model 204 using the weighted path data contained in database 210. Some paths in database 210 may be included in connectivity model 204 and some may not be included depending on the weights. In some embodiments, a door popularity index is implemented to remove insignificant connections from connectivity model 204. This popularity index may be implemented in a variety of ways. For example, a simple rule may be implemented to remove any paths with a weight below a certain threshold. Further, a statistical approach can be implemented such that connections with a weights that fall below a threshold percentage level (e.g., 5%) relative to all paths in database 210 are removed from connectivity model 204. In another example, a machine learning approach can be implemented to classify connections as either real or false connections. A Poisson mixture model can be used to dynamically separate the connections in database 210 into groupings with similar weights. Groups with smaller Poisson rate parameters may then be removed from connectivity model 204. This functionality may eliminate false connections that may be generated when users enter doors with another user and the users do not each scan their ID badge, for example. For instance, referring again to the example of FIG. 3, user 302 may enter door 324 with a second user and the second user may not scan an ID badge at door 324. The second user may then scan the ID badge at door 332 such that a false connection between door 312 and door 332 may be formed. Phenomenon like this should not happen often and can be made irrelevant using the approaches described above.

Figure 5:
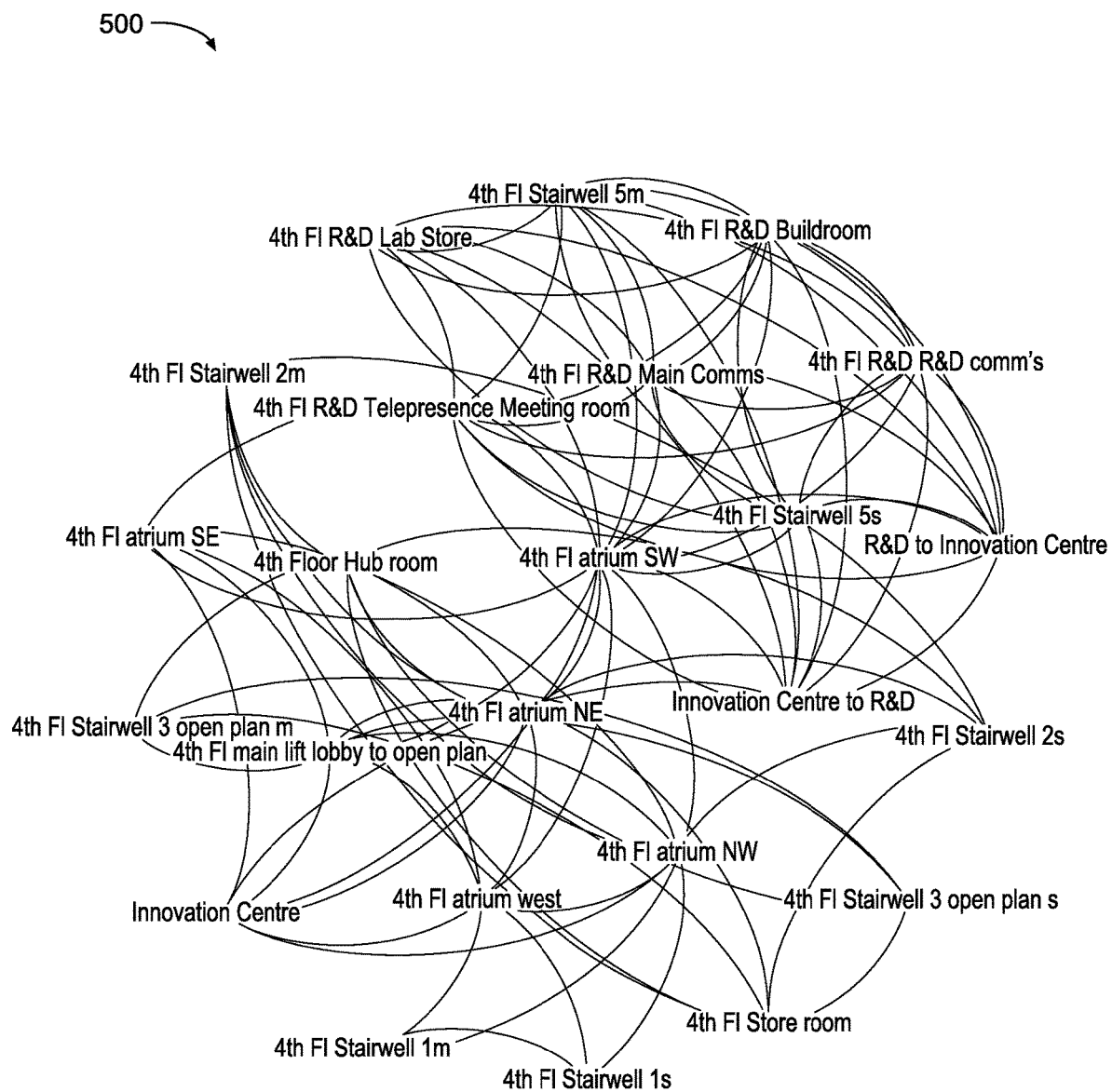
FIG. 5 is a drawing of a visualization of a connectivity model that can be generated using the process of FIG. 4, according to some embodiments.
Figure 6:
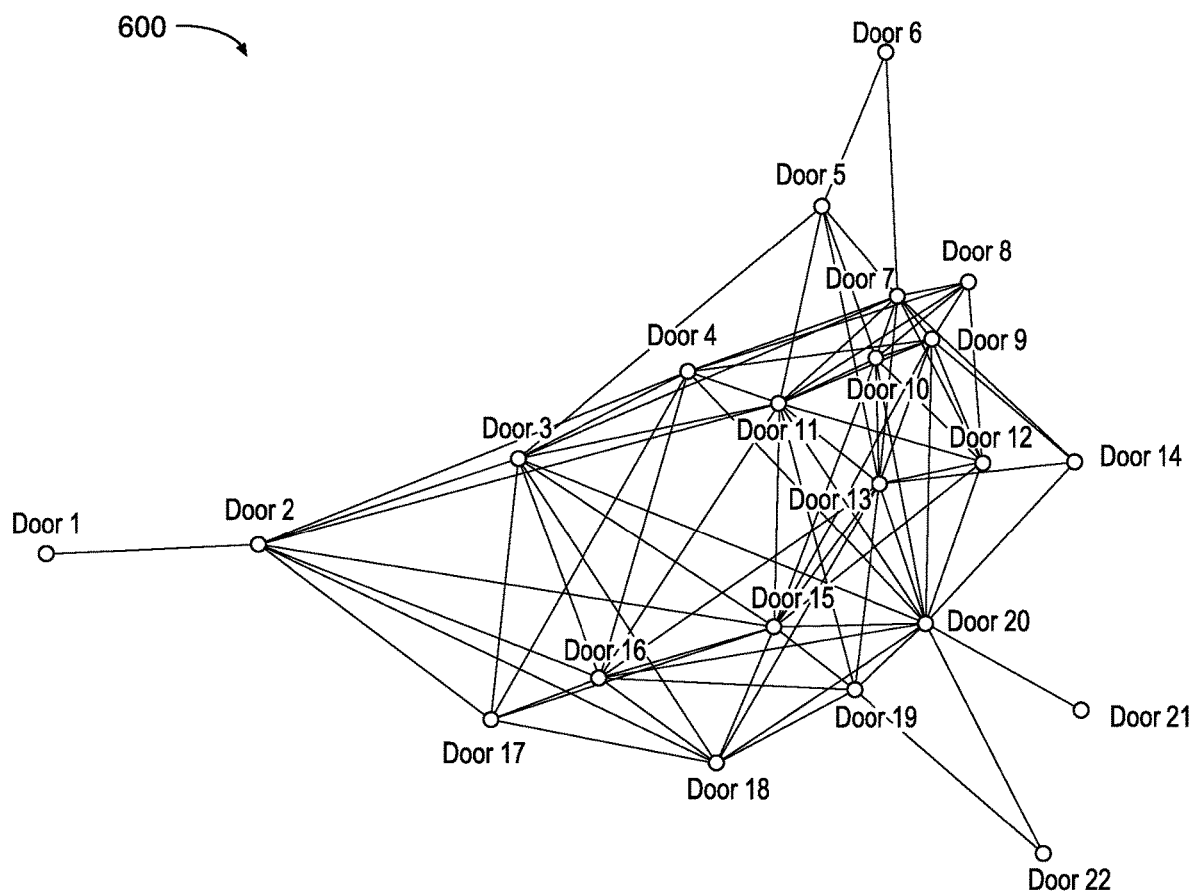
FIG. 6 is another drawing of a visualization of a connectivity model that can be generated using the process of FIG. 4, according to some embodiments.

Referring now to FIG. 5, a drawing of a visualization of an example connectivity model 500 is shown, according to some embodiments. Connectivity model 500 is shown to include various connections between various spaces on a floor within building 10. For example, a store room on the fourth floor of building 10 is shown to be accessible via a plurality of other spaces on the fourth floor of building 10. Similarly, referring now to FIG. 6, a drawing of a visualization of another example connectivity model 600 is shown, according to some embodiments. Connectivity model 600 is similar to connectivity model 500, however connectivity model 600 shows relationships between different doors within building 10 instead of spaces within building 10. FIGS. 5 and 6 are provided as examples of the complexity of connectivity model 204 as described above.

Configuration of Exemplary Embodiments

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions.

Although the figures show a specific order of method steps, the order of the steps may differ from what is depicted. Also two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

What is claimed is:

1. A method in an access control system, the method comprising:
    maintaining a database of access control event data generated by a plurality of access control devices installed in a building;
    iterating through the access control event data in order to generate a connectivity model for the building by, for each iteration:
        identifying an interaction between a user and an access control device for a first door in the building that occurs at a first time;
        identifying an interaction between the user and an access control device for a second door in the building that occurs at a second time;
        determining if a difference between the first time and the second time is less than a threshold period of time;
        determining if the connectivity model includes a connection between the first door and the second door responsive to a determination that the difference is less than the threshold;

creating the connection between the first door and the second door responsive to a determination that the connectivity model does not include the connection; and updating a weight associated with the connection responsive to a determination that the connectivity model does include the connection.

2. The method of claim 1, further comprising removing or disregarding the connection from the connectivity model based on the weight.

3. The method of claim 2, wherein removing or disregarding the connection from the connectivity model based on the weight comprises removing or disregarding the connection from the connectivity model in response to the weight being less than a threshold.

4. The method of claim 2, wherein the connection comprises a first connection and the weight comprises a first weight, and wherein removing or disregarding the first connection from the connectivity model based on the first weight comprises removing or disregarding the first connection from the connectivity model based on a comparison of the first weight to a second weight associated with a second connection.

5. The method of claim 4, further comprising calculating a weight associated with each connection in the connectivity model and removing or disregarding the connection in response to the weight falling below a threshold percentage within a distribution of the weights across the connections in the connectivity model.

6. The method of claim 4, further comprising:
calculating a weight associated with each connection in the connectivity model;
applying a model to the connections to separate the connections into a plurality of clusters of connections based on similarities of weights;
determining a first cluster of the plurality of clusters having smallest weights; and
removing or disregarding the connections belonging to the first cluster.

7. The method of claim 6, wherein the model comprises a multi-state Poisson mixture model, and wherein determining the first cluster comprises identifying the first cluster as a cluster of the plurality of clusters having a smallest Poisson rate parameter from among a plurality of Poisson rate parameters of the plurality of clusters.

8. The method of claim 1, further comprising ignoring the interaction between the user and the first door and the interaction between the user and the second door responsive to a determination that the difference is greater than the threshold.

9. The method of claim 1, further comprising identifying an access control zone within the building using the connectivity model.

10. The method of claim 9, further comprising generating an alarm that indicates an intrusion associated with the building responsive to multiple door forced open events occurring within the access control zone within a time period.

11. The method of claim 1, further comprising estimating a probability of a first user coming into contact with a second user or a restricted location using the connectivity model based on a last access control device with which the first user interacted.

12. An access control system comprising:
one or more processors; and
one or more computer-readable storage media having instructions stored thereon that, when executed by the one or more processors, cause the one or more processors to implement operations comprising:
maintaining a database of access control event data generated by a plurality of access control devices installed in a building;
iterating through the access control event data in order to generate a connectivity model for the building by, for each iteration:
identifying an interaction between a user and an access control device for a first door in the building that occurs at a first time;
identifying an interaction between the user and an access control device for a second door in the building that occurs at a second time;
determining if a difference between the first time and the second time is less than a threshold period of time;
determining if the connectivity model includes a connection between the first door and the second door responsive to a determination that the difference is less than the threshold;
creating the connection between the first door and the second door responsive to a determination that the connectivity model does not include the connection; and
updating a weight associated with the connection responsive to a determination that the connectivity model does include the connection.

13. The system of claim 12, the operations further comprising removing or disregarding the connection from the connectivity model based on the weight.

14. The system of claim 13, wherein removing or disregarding the connection from the connectivity model based on the weight comprises removing or disregarding the connection from the connectivity model in response to the weight being less than a threshold.

15. The system of claim 13, wherein the connection comprises a first connection and the weight comprises a first weight, and wherein removing or disregarding the first connection from the connectivity model based on the first weight comprises removing or disregarding the first connection from the connectivity model based on a comparison of the first weight to a second weight associated with a second connection.

16. The system of claim 15, the operations further comprising calculating a weight associated with each connection in the connectivity model and removing or disregarding the connection in response to the weight falling below a threshold percentage within a distribution of the weights across the connections in the connectivity model.

17. The system of claim 15, the operations further comprising:
calculating a weight associated with each connection in the connectivity model;
applying a model to the connections to separate the connections into a plurality of clusters of connections based on similarities of weights;
determining a first cluster of the plurality of clusters having smallest weights; and
removing or disregarding the connections belonging to the first cluster.

18. The system of claim 17, wherein the model comprises a multi-state Poisson mixture model, and wherein determining the first cluster comprises identifying the first cluster as a cluster of the plurality of clusters having a smallest Poisson rate parameter from among a plurality of Poisson rate parameters of the plurality of clusters.

19. The system of claim 12, the operations further comprising ignoring the interaction between the user and the first door and the interaction between the user and the second door responsive to a determination that the difference is greater than the threshold.

20. The system of claim 12, the operations further comprising identifying an access control zone within the building using the connectivity model.

21. The system of claim 20, the operations further comprising generating an alarm that indicates an intrusion associated with the building responsive to multiple door forced open events occurring within the access control zone within a time period.

22. The system of claim 12, the operations further comprising estimating a probability of a first user coming into contact with a second user or a restricted location using the connectivity model based on a last access control device with which the first user interacted.

* * * * *